(12) United States Patent
Jang et al.

(10) Patent No.: US 11,824,529 B2
(45) Date of Patent: Nov. 21, 2023

(54) CIRCUIT FOR ADJUSTING RESONANCE FREQUENCY AND ELECTRONIC DEVICE INCLUDING SAME

(71) Applicant: Samsung Electronics Co., Ltd., Gyeonggi-do (KR)

(72) Inventors: Seokmin Jang, Gyeonggi-do (KR); Daehyun Kim, Gyeonggi-do (KR); Donghyeok Lee, Gyeonggi-do (KR)

(73) Assignee: Samsung Electronics Co., Ltd

(*) Notice: Subject to any disclaimer, the term of this patent is extended or adjusted under 35 U.S.C. 154(b) by 807 days.

(21) Appl. No.: 16/960,148

(22) PCT Filed: Jan. 3, 2019

(86) PCT No.: PCT/KR2019/000107
§ 371 (c)(1),
(2) Date: Jul. 6, 2020

(87) PCT Pub. No.: WO2019/135622
PCT Pub. Date: Jul. 11, 2019

(65) Prior Publication Data
US 2021/0126633 A1  Apr. 29, 2021

(30) Foreign Application Priority Data
Jan. 5, 2018  (KR) .................. 10-2018-0001597

(51) Int. Cl.
*H03K 17/96* (2006.01)
*H01Q 1/24* (2006.01)
(Continued)

(52) U.S. Cl.
CPC ........... *H03K 17/962* (2013.01); *H01Q 1/243* (2013.01); *H04B 1/3827* (2013.01); *H04B 1/401* (2013.01); *H03K 2217/960735* (2013.01)

(58) Field of Classification Search
CPC ..... H03K 17/962; H03K 2217/960735; H03K 17/9622; H03K 17/975; H03K 17/955;
(Continued)

(56) References Cited

U.S. PATENT DOCUMENTS

2006/0155391 A1* 7/2006 Pistemaa ........... H04M 2250/12
2011/0065429 A1  3/2011 Kim et al.
(Continued)

FOREIGN PATENT DOCUMENTS

KR  1020080084154  9/2008
KR  1020090109382  10/2009
(Continued)

OTHER PUBLICATIONS

Korean Office Action dated Oct. 27, 2021 issued in counterpart application No. 10-2018-0001597, 16 pages.
(Continued)

*Primary Examiner* — Lana N Le
(74) *Attorney, Agent, or Firm* — The Farrell Law Firm, P.C.

(57) ABSTRACT

An electronic device according to an embodiment includes a first touch key disposed in a first area of the electronic device, a second touch key disposed in a second area of the electronic device, an antenna, a communication circuit, electrically connected to the antenna, for transmitting or receiving a signal using the antenna, a sensing circuit for sensing an external object corresponding to the electronic device, a frequency adjustment circuit, electrically connected to the antenna, adjusting a resonance frequency of the antenna, and a processor wherein the processor detects the external object using the sensing circuit while communicating with an external device using the communication circuit, in response to detecting the external object, detects an amount of change of capacitance corresponding to the
(Continued)

external object using the first touch key or the second touch key. If a first amount of change of capacitance detected through the first touch key is greater than a second amount of change of capacitance detected through the second touch key, the electronic device communicates using the communication circuit wherein the frequency adjustment circuit is designated in a first mode. If the second amount of change of capacitance detected through the second touch key is greater than the second amount of change of capacitance detected through the first touch key, the electronic device communicates using the communication circuit wherein the frequency adjustment circuit is designated in a second mode. In addition, various other embodiments are possible.

15 Claims, 9 Drawing Sheets

(51) Int. Cl.
*H04B 1/3827* (2015.01)
*H04B 1/401* (2015.01)

(58) Field of Classification Search
CPC .......... H01Q 1/243; H01Q 5/10; H01Q 23/00; H01Q 9/0442; H01Q 1/242; H01Q 5/307; H01Q 7/005; H04B 1/3827; H04B 1/401; H04B 1/3833; H04B 17/11; H04B 1/0053; H04B 1/006; H04B 1/18; G06F 1/1684; G06F 1/1698; H04M 1/72454; H04M 2250/22; H04M 1/0281; H04M 2250/12; H04M 1/23; H03J 1/06; H03J 2200/10; H03H 2210/025; H03H 9/6489; H03H 7/46; H03H 2009/02204; H03H 7/38; H01P 1/213

See application file for complete search history.

(56) References Cited

U.S. PATENT DOCUMENTS

| | | | | |
|---|---|---|---|---|
| 2013/0342421 | A1* | 12/2013 | Katz | H01Q 7/005 |
| | | | | 343/852 |
| 2014/0024321 | A1* | 1/2014 | Zhu | H04B 1/18 |
| | | | | 455/77 |
| 2018/0088739 | A1 | 3/2018 | Rouaissia et al. | |
| 2018/0212313 | A1* | 7/2018 | Harper | H01Q 5/321 |
| 2018/0351589 | A1 | 12/2018 | Shin et al. | |
| 2019/0020095 | A1* | 1/2019 | Tunnell | H01Q 5/10 |
| 2019/0383065 | A1* | 12/2019 | Spick | H03K 17/955 |
| 2022/0404175 | A1* | 12/2022 | Jadidian | H03K 17/955 |
| 2023/0046166 | A1* | 2/2023 | Hwang | H01Q 5/307 |

FOREIGN PATENT DOCUMENTS

| | | |
|---|---|---|
| KR | 1020110028035 | 3/2011 |
| KR | 1020110074227 | 6/2011 |
| KR | 1020160051546 | 5/2016 |
| WO | WO2017082585 | 5/2017 |

OTHER PUBLICATIONS

KR Notice of Patent Grant dated Mar. 28, 2022 issued in counterpart application No. 10-2018-0001597, 4 pages.
PCT/ISA/210 Search Report issued on PCT/KR2019/000107, dated Apr. 5, 2019, pp. 5.
PCT/ISA/237 Written Opinion issued on PCT/KR2019/000107, dated Apr. 5, 2019, pp. 6.

* cited by examiner

CIRCUIT FOR ADJUSTING RESONANCE FREQUENCY AND ELECTRONIC DEVICE INCLUDING SAME

PRIORITY

This application is a National Phase Entry of International Application No. PCT/KR2019/000107, which was filed on Jan. 3, 2019, and claims priority to Korean Patent Application No. 10-2018-0001597, filed in the Korean Intellectual Property Office on Jan. 5, 2018, the content of each of which is incorporated herein by reference.

TECHNICAL FIELD

Various embodiments of the disclosure relate to a circuit for adjusting a resonance frequency for securing radio wave transmission and reception performance and an electronic device including the same.

BACKGROUND ART

Electronic devices are being provided as various types of portable wireless devices such as smart phones, tablet personal computers, and personal digital assistants (PDAs).

DISCLOSURE OF INVENTION

Technical Problem

When an electronic device transmits radio waves to a free space or receives external radio waves through an antenna, external objects such as a human body around the electronic device may affect radio wave transmission and reception. As an example, a built-in antenna is preferred for the purpose of miniaturization and design improvement of an electronic device. Thus, a hand, carrying the electronic device, is easy to be near the antenna, and the possibility that the performance of radio wave transmission and reception is deteriorated due to the hand is increasing. In addition, due to the spatial or positional relationship between the antenna and the external object, the performance of radio wave transmission and reception may be different according to whether the hand, carrying the electronic device, is the right hand and the left hand. For example, the reception sensitivity when talking with the left hand holding the electronic device and the reception sensitivity when talking with the right hand holding the electronic device may be different with a difference greater than a threshold value.

According to an embodiment of the disclosure, a circuit for adjusting a resonance frequency to reduce a decrease in performance of radio wave transmission and reception due to an external object such as a hand is provided, and an electronic device including the circuit is also provided.

According to an embodiment of the disclosure, a circuit for adjusting a resonance frequency for reducing a difference in radio wave transmission and reception performance between when carrying an electronic device with the right hand and when carrying the electronic device with the left hand is provided, and an electronic device including the circuit is also provided.

Solution to Problem

An electronic device according to an embodiment includes a first touch key disposed in a first area of the electronic device, a second touch key disposed in a second area of the electronic device, an antenna, a communication circuit, electrically connected to the antenna, for transmitting or receiving a signal using the antenna, a sensing circuit for sensing an external object corresponding to the electronic device, a frequency adjustment circuit, electrically connected to the antenna, for adjusting a resonance frequency of the antenna, and a processor wherein the processor detects the external object using the sensing circuit while communicating with an external device using the communication circuit, in response to detecting the external object, detects an amount of change of capacitance corresponding to the external object using the first touch key or the second touch key, wherein based on that a first amount of change of capacitance detected through the first touch key is greater than a second amount of change of capacitance detected through the second touch key, the electronic device communicates using the communication circuit wherein the frequency adjustment circuit is designated in a first mode, and wherein based on that the second amount of change of capacitance detected through the second touch key is greater than the first amount of change of capacitance detected through the first touch key, the electronic device communicates using the communication circuit wherein the frequency adjustment circuit is designated in a second mode.

Advantageous Effects of Invention

An electronic device including a circuit for adjusting a resonance frequency according to various embodiments of the disclosure reduces a decrease in performance of radio wave transmission and reception due to an external object such as a hand. And as it reduces the difference in radio wave transmission and reception performance when carrying the electronic device between with the right hand and with the left hand, it is possible to improve a communication quality and a communication speed.

BEST MODE FOR CARRYING OUT THE INVENTION

Figure 1:
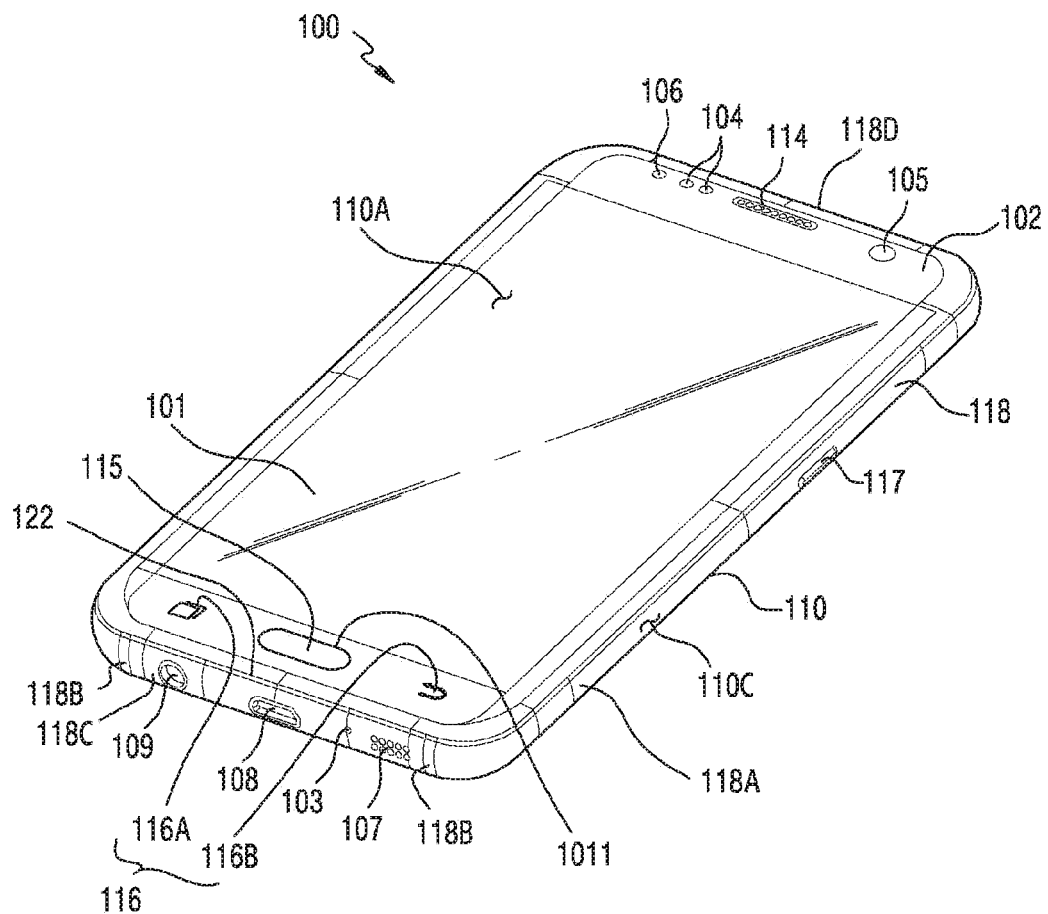
FIG. 1 is a perspective view of a front of an electronic device according to an embodiment.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

In this document, "configured to (or set to)", depending on the situation, is interchangeably used to be, for example, "be suitable to", "with the ability to", "modified to", "designed to" and "be made to", in hardware or software. In some situations, the expression "a device configured to" means that the device "is able to" together with other devices or parts. For example, the phrase "processors configured (or set) to perform A, B, and C" means a dedicated processor (e.g., an embedded processor) to perform the corresponding operations, or means a general-purpose processor (e.g., CPU or application processor) performing the corresponding operations by executing one or more software programs stored in the memory device.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

Figure 2:
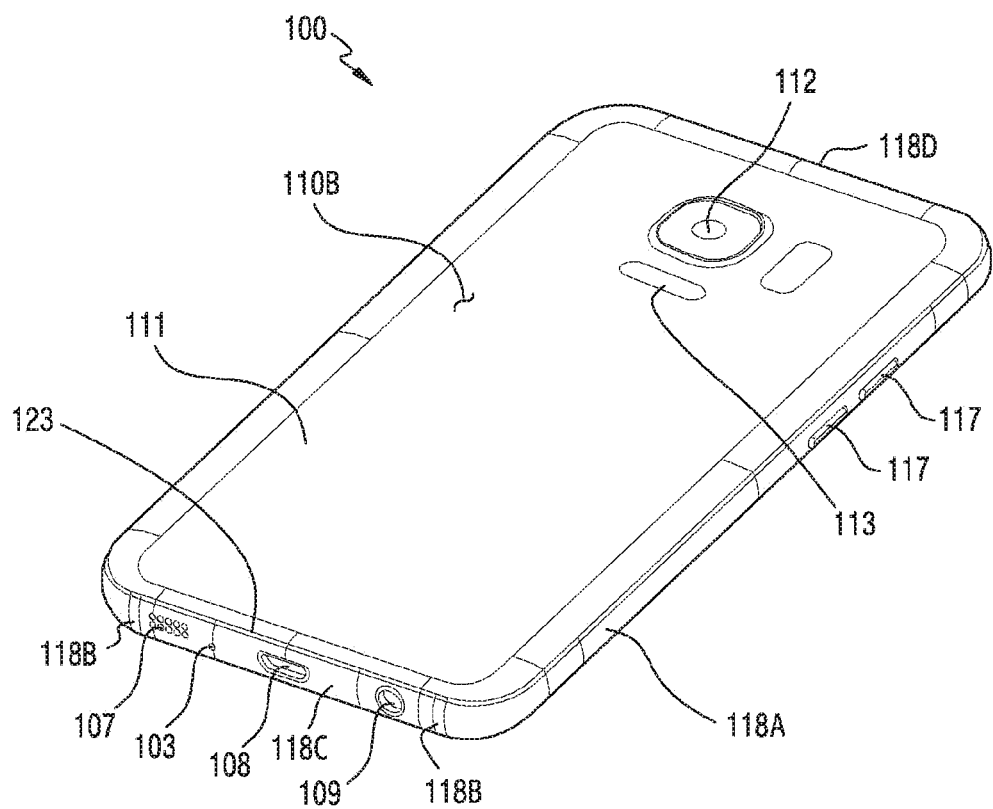
FIG. 2 is a perspective view of the rear of the electronic device of FIG. 1.
Figure 3A:
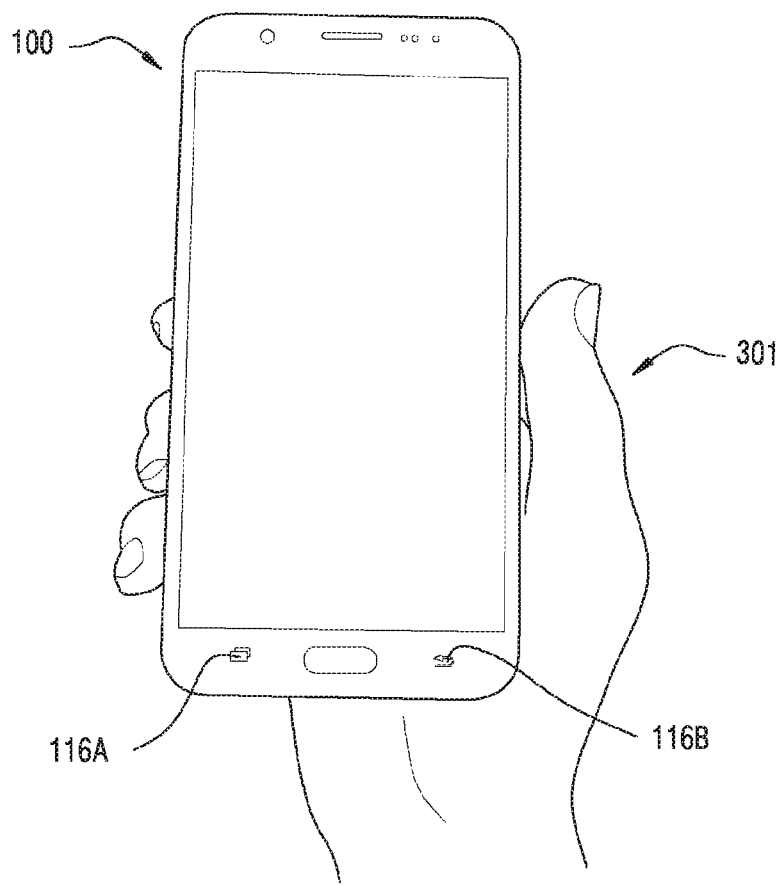
FIG. 3A illustrates a state in which the electronic device is held with a right hand according to an embodiment.
Figure 3B:
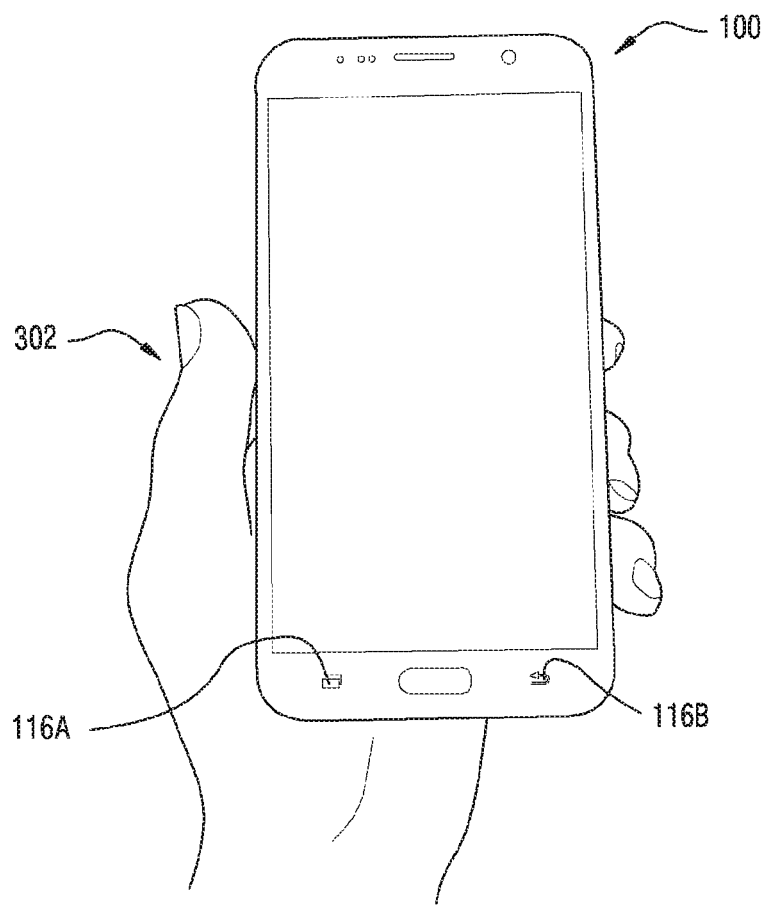
FIG. 3B illustrates a state in which the electronic device is held with a left hand according to an embodiment.

FIG. 1 is a perspective view of a front of an electronic device according to an embodiment. FIG. 2 is a perspective view of a rear of the electronic device of FIG. 1. FIG. 3A illustrates a state in which the electronic device according to an embodiment is held with the right hand, and FIG. 3B illustrates a state in which the electronic device according to an embodiment is held with the left hand.

Referring to FIG. 1 and FIG. 2, the electronic device 100 according to an embodiment includes a first surface (or front surface) 110A, a second surface (or rear surface) 110B, and a first surface 110A and it may include a housing 110 including a side (110C) surrounding the space between the second surface (110B). According to an embodiment, the first surface 110A may be formed by the front plate 102 having at least a portion of which is substantially transparent. The second surface 110B may be formed by a substantially opaque back plate 111. The side surface 110C may be formed by a side bezel structure (or "side member") 118 that is coupled to the front plate 102 and the back plate 111 and includes metal and/or polymer. In some embodiments, the back plate 111 and side bezel structure 118 may be integrally formed and include the same material (eg, a metal material such as aluminum). The side bezel structure 118 includes a square ring-shaped outer structure 118A formed of a metallic material, and a mid plate (not shown) extending from the outer structure 118A or coupled to the outer structure 118A, the mid plate is disposed between the display 101 and the back plate 111. The side bezel structure 118 includes an outer structure 118A and an internal structure (not shown) of a material such as a polymer bonded to the mid plate. According to an embodiment, in order to keep the radio wave radiation performance of the electronic device 100 from being deteriorated by the side bezel structure 118, it is designed that a portion of the side bezel structure 118 is physically or electrically separated from the rest portion of the side bezel structure 118. The internal structure maintains a state that a portion 118C and 118D of the side bezel structure 118 is physically or electrically separated from the remainder of the side bezel structure 118. A portion 118B of the internal structure is disposed in gaps of the outer structure 118A to form a portion of the side surface 110C of the electronic device 100. According to an embodiment, the separated parts (e.g., 118C or 118D) of the side bezel structure 118 are electrically connected to the ground of the electronic device 100.

According to certain embodiments, a portion 118B or 118D of the side bezel structure 118 is electrically connected to a built-in antenna (not shown) to serve to extend an antenna length.

According to certain embodiments, a portion 118B or 118D of the side bezel structure 118 is designed as an independent antenna radiator for communication in a corresponding frequency band by being connected to a communication circuit of the electronic device 100.

According to a certain embodiments, the electronic device (100) includes a display 101, audio modules (103, 107, 114), sensor modules (104, 119), camera modules (105, 112, 113), keys It may include at least one or more of the input devices (115, 116, 117), the indicator (106), and the connector holes (108, 109). In some embodiments, the electronic device (100) may omit at least one of the components (eg, the indicator (106)) or additionally include other components.

The display (101) can be exposed, for example, through a significant portion of the front plate (102). The display (101) may be disposed adjacent to or combined with a touch sensing circuit, a pressure sensor capable of measuring the intensity (pressure) of the touch, and/or a digitizer detecting a magnetic field type stylus pen.

The audio modules (103, 107, 114) may include a microphone hole 103 and speaker holes (107, 114). In the microphone hole (103), a microphone for acquiring external sound may be disposed therein, and in some embodiments, a plurality of microphones may be arranged to sense the direction of sound. The speaker holes (107, 114) may include an external speaker hole (107) and a call receiver hole (114). In some embodiments, the speaker holes (107, 114) and the microphone hole (103) may be implemented as one hole, or a speaker may be included without the speaker holes (107, 114) (eg, a piezo sneaker).

The sensor modules (104, 119) may generate an electrical signal or data value corresponding to an internal operating state of the electronic device (100) or an external environmental state. The sensor modules (104, 119) may include, for example, a first sensor module (104) (eg, proximity sensor) and/or a second sensor module (not shown) disposed on the first side (110A) of the housing (110) (eg, a fingerprint sensor), and/or a third sensor module (119) (eg, an HRM sensor) disposed on the second surface (110E) of the housing (110). The fingerprint sensor may be disposed on the first surface 110 (eg, the home key button (115)) of the housing (110), as well as on the second surface (110B). The electronic device (100) includes a sensor module (not shown), for example, a gesture sensor, a gyro sensor, a barometric pressure sensor, a magnetic sensor, an acceleration sensor, a grip sensor, a color sensor, an infrared (IR) sensor, a bio sensor, a temperature sensor, It may further include at least one of a humidity sensor or an illuminance sensor (104).

The camera modules (105, 112, 113) include a first camera device (105) disposed on the first surface 110A of the electronic device (100), and a second camera device (112) disposed on the second surface (110B), and/or flash (113). The camera modules (105, 112) may include one or more lenses, an image sensor, and/or an image signal processor. The flash (113) may include, for example, a light emitting diode or a xenon lamp. In some embodiments, two or more lenses (wide-angle and telephoto lenses) and image sensors may be disposed on one side of the electronic device (100).

Key input apparatus 115, 116, 117 includes a home key button 115 disposed on the first surface 110A of the housing 110, a touch-key (or a touch Pad) 116 placed around the home key button 115, and/or side key button 117 disposed on side 110C of the housing 110.

The front plate 101 includes a hole 1011 formed in an area not overlapping the display, and the home key button 115 is coupled to the hole 1011. A switch such as a dome switch aligned to the home key button 115 is disposed between the front plate 101 and the mid plate, and when the home key button 115 is pressed, an input by energization at the switch occurs. When an input occurs through the home key button 115, the electronic device 100 displays a main home screen. The main home screen is the first screen displayed on the display 101 when the electronic device 100 is turned on. When a plurality of home screens are provided in a switchable page form, the main home screen is the first home screen among the plurality of home screens. The home screen displays icons for executing applications, a time, or a date. According to various embodiments of the disclosure, the home screen displays a state of the electronic device 100 such as a battery charge state, an intensity of received signal, or a current time. According to a certain embodiment, when an input is detected through the home key button 115, the electronic device 100 enters a sleep mode or a low power mode. In the sleep mode or the low power mode, the electronic device 100 performs only basic operations such as periodically performing listening to a radio signal from the outside, and deactivate elements such as the display 101. When an input is detected through the home key button 115, the electronic device 100 switches from a sleep mode or a low power mode to wake-up mode, and activates elements such as the display 101.

The touch key 116 is disposed near the rear surface of the front plate 101 or between the front plate 101 and the mid plate in an area of the front plate 101 that does not overlap the display 101. The touch key 116 includes a first touch key 116A and a second touch key 116B, and the home key button 115 is disposed between the first touch key 116A and the second touch key 116B. The first touch key 116A and the second touch key 116B are generally disposed at the lower left and lower right of the electronic device 100 in the long direction, respectively, and are respectively referred to as 'left touch key' and 'right touch key'. The touch key 116 is not limited thereto and thus is designed to be that it is disposed at another location, or an additional touch key is further included According to various embodiments, the touch key 116 is included in at least a portion of the display 101 according to the shape of the electronic device 100. For example, the electronic device 100 (e.g., the processor 420) uses the designated first area of the display 101 as the first touch key 116A by using the touch circuit included in the display 101, and uses the designated second area of the display 101 as the second touch key 116B.

The touch key 116 includes a device for generating an electromagnetic field. According to an embodiment, the device for generating the electromagnetic field of the touch key 116 includes a conductive element disposed between the front plate 102 and the mid plate of the side bezel structure 118, and when a voltage is applied to the conductive element, the electromagnetic field is generated. In the area of the front plate 102 aligned with the touch key 116, there is a marker indicating the touch key 116, and when a finger is touched in this area, a change of the electromagnetic field (or change of capacitance) formed in the touch key 116 changes) occurs. The electronic device 100 detects a touch input based on an amount of change in capacitance of the touch key 116 and perform various functions based on the touch input. The touch input through the touch key 116 is recognized when the amount of change in capacitance of the touch key 116 is greater than or equal to a threshold.

The amount of change in capacitance of the touch key 116 varies according to a spatial or locational relationship between the electronic device 100 and an external object such as a hand. For example, when holding the electronic device 100 with one hand with the back of the electronic device 100 facing the palm of the hand the electronic device 100, the amount of change in capacitance of the left touch key (116A) and the amount of change in capacitance of the right touch key (116B) are different between when the electronic device 100 is held with the left hand and when the electronic device 100 is held with the right hand. When the electronic device 100 is held by the right hand 301 as in FIG. 3A, the influence of the hand 301 is applied to the left touch key 116A more than the right touch key 116B, and an amount of change in capacitance of the left touch key 116A is greater than an amount of change in capacitance change of the right touch key 116B. When the electronic device 100 is held by the left hand 302 as in FIG. 3B, the influence of the hand 302 is applied to the right touch key 116A more than the left touch key 116A, and an amount of change in capacitance of the right touch key 116B is greater than an amount of change in capacitance of the left touch key 116A. As shown in FIGS. 3A and 3B, when holding the electronic device 100 with one hand, an amount of change in capacitance of the touch key 116 may be less than a threshold value that is a criterion for touch input recognition. FIG. 3A and FIG. 3B are only one example, and according to the spatial or positional relationships between the various external object and the electronic device 100, an amount of change in capacitance of the left touch key 116A and an amount of change in capacitance of the right touch key 116B vary.

According to an embodiment of the disclosure, the electronic device 100 is designed to recognize that the electronic device 100 is held with the left hand (hereinafter, the left hand grip state) when the capacitance change amount of the left touch key 116A is greater than the capacitance change amount of the right touch key 116B. According to a certain embodiment, as shown in FIG. 3A, when the right touch key 116B is touched and off with the finger of the right hand while the electronic device 100 is held in the left hand, the amount of change in capacitance of the right touch key 116B is instantaneously above the threshold value. The electronic device 100 is designed to recognize that a touch input generates from the right touch key 116B in the left hand grip state when the capacitance change amount of the right touch key 116B is momentarily greater than or equal to the threshold value while the electronic device 100 is held with the left hand. The meaning of that capacitance change amount is instantaneously more than or equal to the threshold value defined as when the capacitance change amount is greater than or equal to the threshold value during a threshold time.

Electronic device 100 is designed to recognize that the electronic device 100 held with right hand (hereinafter, the right hand grip state) when an amount of change in capacitance of the right touch key 116B is more than an amount of change in capacitance of the left touch key 116A. According to a certain embodiment, as shown in FIG. 3B, when the left touch key 116A is touched and off with the finger of the left hand while the electronic device 100 is held in the right hand, the amount of change in capacitance of the left touch key 116A is instantaneously above the threshold value. The electronic device 100 is designed to recognize that a touch input generates from the left touch key 116B in the right hand grip state when the capacitance change amount of the left touch key 116A is momentarily greater than or equal to the threshold value while the electronic device 100 is held with the right hand. According to a certain embodiment, as shown in FIG. 3B, when the right touch key 116E is touched and off with the finger of the left hand while the electronic device 100 is held in the right hand, the amount of change in capacitance of the right touch key 116B is instantaneously above the threshold value. The electronic device 100 is designed to recognize that a touch input generates from the right touch key 116A in the right hand grip state when the capacitance change amount of the right touch key 116B is momentarily greater than or equal to the threshold value while the electronic device 100 is held with the right hand.

The electronic device 100 includes a grip sensor. According to an embodiment of the disclosure, the electronic device 100 is designed to perform determining operation that the electronic device 100 is in a left-hand grip state or a right-hand grip state through the touch key 116 after it is identified by the grip sensor that the electronic device 100 is in a gripped state by a user's hand. Such a design reduces power consumption by preventing the user from performing an operation which is determining the left-hand grip state or the right-hand grip state through the touch key 116 when the user does not hold the electronic device 100.

According to an embodiment, when the object is positioned about 20 cm or less adjacent to the placement area of the proximity sensor 104 of the front side 110A, the electronic device 100 recognizes the object by using the proximity sensor 104. For example, the proximity sensor 104 includes a light emitting unit and a light receiving unit, and light output from the light emitting unit is emitted to the outside through the front plate 101, and at least a part of the light scattered or reflected from the object is introduced into the light receiving unit through the front plate 101. The light receiving unit converts the introduced light into an electrical signal (or digital value), and provide the electrical signal to the processor of the electronic device 100. The processor acquires distance information between the object and the electronic device 100 or recognize the proximity of the object based on the electrical signal provided from the light receiving unit. According to an embodiment, when the proximity of the object is confirmed through the proximity sensor, the processor deactivates the display 101. For example, a user face may touch the screen of the electronic device 100 during a call, but incorrect input through the screen is prevented because the display 101 is inactive.

According to an embodiment, when the left hand grip state or the right hand grip state is identified and then the proximity of the object is recognized through the proximity sensor 104, the processor is designed to deactivate the touch key 116 or to be nonresponsive to change of the capacitance of the touch key 116. For example, when the electronic device 100 is held with the left or right hand and is approaching the user face during a call, a part of the face touches the touch key 116 area of the front side 110A and affects the amount of capacitance change of the touch key 116. In this case, since the touch key 116 is in an inactive state and does not react to the amount of capacitance change of the touch key 116, it prevents errors of a wrong input or errors in determination of a left hand grip state or right hand grip state through the touch key 116.

The grip sensor is electrically connected to at least one antenna (hereinafter, a grip sensor antenna) for grip sensing, and the grip sensor antenna is installed at various positions of the electronic device 100. When a current flows through the grip sensor antenna, an electromagnetic field is formed. When the electronic device 100 is held by hand, a change in the electromagnetic field (or a change in capacitance) occurs. The grip sensor determines a state (hereinafter referred to as a 'grip state') of the user's hand holding the electronic device 100 based on a change in capacitance acquired through the grip sensor antenna, and provide a corresponding signal to the processor. According to a certain embodiment, the grip sensor provides a change in capacitance obtained through the grip sensor antenna to the processor, and the processor determines the grip state based on the change in capacitance. For example, when the amount of change in capacitance obtained through the grip sensor antenna is greater than or equal to a threshold, the grip state is recognized. According to an embodiment, the grip sensor uses signals in a frequency band of about 1 MHz to 13 MHz for grip sensing.

According to an embodiment, the grip sensor antenna and the antenna (hereinafter referred to as 'communication antenna') for other communication that transmits and receives signals in a frequency band such as about 600 MHz to 13 GHz [e.g., long term evolution (LIE), Voice, EVDO (evolution-data optimized, or evolution-data only), the antenna for HSPA (high speed packet access), GPS (global positioning system), PT (bluetooth)/WiFi (wireless fidelity), etc.] are designed in one, antenna (hereinafter referred to as 'common antenna'). The common antenna is designed to satisfy both the characteristics of the grip sensor antenna and the characteristics and band of the communication antenna. According to an embodiment, the electronic device 100 includes a structure for branching the grip sensing signal and the communication signal from the common antenna. For example, the electronic device 100 includes a circuit such as a filter for branching the frequency band for grip sensing and the frequency band for communication.

According to a certain embodiment, the grip sensor antenna and communication antenna are individually designed. In order to improve the grip sensing performance, the grip sensor antenna has a shape or a size similar to that of the communication antenna and is disposed near the communication antenna. Various structures or circuits for reducing the influence of the grip sensor antenna on the communication antenna are provided.

The antenna is defined as a transducer that transmits electromagnetic waves from a transmission line to a free space or from a free space to a transmission line, and is designed to transmit or receive electromagnetic energy in a direction and polarization suitable for a purpose. The radiation characteristics and impedance of the antenna are related to the antenna performance, and varies according to the shape and size of the antenna, and the material of the antenna. The antenna radiation characteristics include an antenna radiation pattern (or antenna pattern), which is a directional function indicating a relative distribution of power radiated from the antenna, and a polarization state (or antenna polarization) of the radio wave radiated from the antenna. The impedance of the antenna is related to power transmission from the transmitter to the antenna or power transmission from the antenna to the receiver. In order to minimize reflection at the transmission line and the antenna connection, the impedance of the antenna is designed to match the impedance of the transmission line, thereby enabling maximum power transmission (or minimizing power loss) or efficient signal transmission through the antenna. Impedance matching leads to efficient signal flow at a specific frequency (or resonant frequency).

When the electronic device 100 transmits a radio wave to the free space or receives an external radio wave through an antenna, external objects such as a human body around the electronic device 100 affects radio wave transmission and reception. When holding the electronic device 100 by hand as shown in FIGS. 3A and 3B, the hand affects radio wave transmission/reception performance (hereinafter, communication performance). For example, a hand holding the electronic device 100 is treated as a transmission line, and the hand also has characteristic impedance, and thus there is an impedance mismatch. In addition, the hand holding the electronic device 100 changes the capacitance of the antenna to cause an impedance mismatch. Impedance mismatch leads to a power loss or reduction of transmit/receive signals and thus degrades communication performance. In order to eliminate such impedance mismatch, according to an embodiment, the electronic device includes a frequency adjustment circuit. Due to harmonization of external objects such as hands, antennas, and frequency adjustment circuits, impedance mismatch is changed to impedance matching.

Referring to FIG. 3A and FIG. 3B again, due to a spatial or positional relationship between an external object such as a hand and an antenna, an effect on radio wave transmission and reception in a left-hand grip state and an effect on radio wave transmission and reception in a right-hand grip state is different. According to an embodiment, the processor of the electronic device 100 designates (or sets) the frequency adjustment circuit as the first mode in the left hand grip state, and designates the frequency adjustment circuit as the second mode in the right hand grip state. The communication performance when the frequency adjustment circuit is set to the first mode in the left-hand grip state and the communication performance when the frequency adjustment circuit is set to the second mode in the right-hand grip state are approximately constant. The meaning of 'approximately constant' is defined when the difference between comparison objects is smaller than a set threshold. According to an embodiment, the first node or the second mode of the frequency adjustment circuit includes a switching circuit that switches to at least one designated matching circuit or a circuit that adjusts impedance. According to a certain embodiment, the first mode or the second mode of the frequency adjustment circuit includes a circuit for moving the resonant frequency to a designed or specific frequency, or to move the resonant frequency by a specified amount.

According to an embodiment, the frequency adjustment circuit includes a first circuit that connects the first end of the antenna with a feeding part and the second end of the antenna with a ground, and a second circuit that connects the first end of the antenna with the ground and the second end of the antenna to the feeding part. Depending on the first, mode or the second mode, the frequency adjustment circuit switches between the first circuit and the second circuit.

According to a certain embodiment, the electronic device 100 further includes additional touch keys disposed at various positions, and a spatial or positional relationship between an external object such as a hand and an antenna is further detected. The electronic device 100 is designed to reduce the deterioration of communication performance by setting a frequency adjustment circuit according to the detected spatial or positional relationship.

The indicator 106 is disposed, for example, on the first side 110A of the housing 110. The indicator 106, for example, provides status information of the electronic device 100 in a light form, and includes a Light Emitting Diode (LED).

The connector holes 108 and 109 include a first connector hole 108 that accommodates a connector (for example, a USB connector) for transmitting and receiving power and/or data with an external electronic device, and/or an external electronic device, and a second connector hole (for example, an earphone jack) 109 accommodating a connector for transmitting and receiving audio signals.

Figure 4:
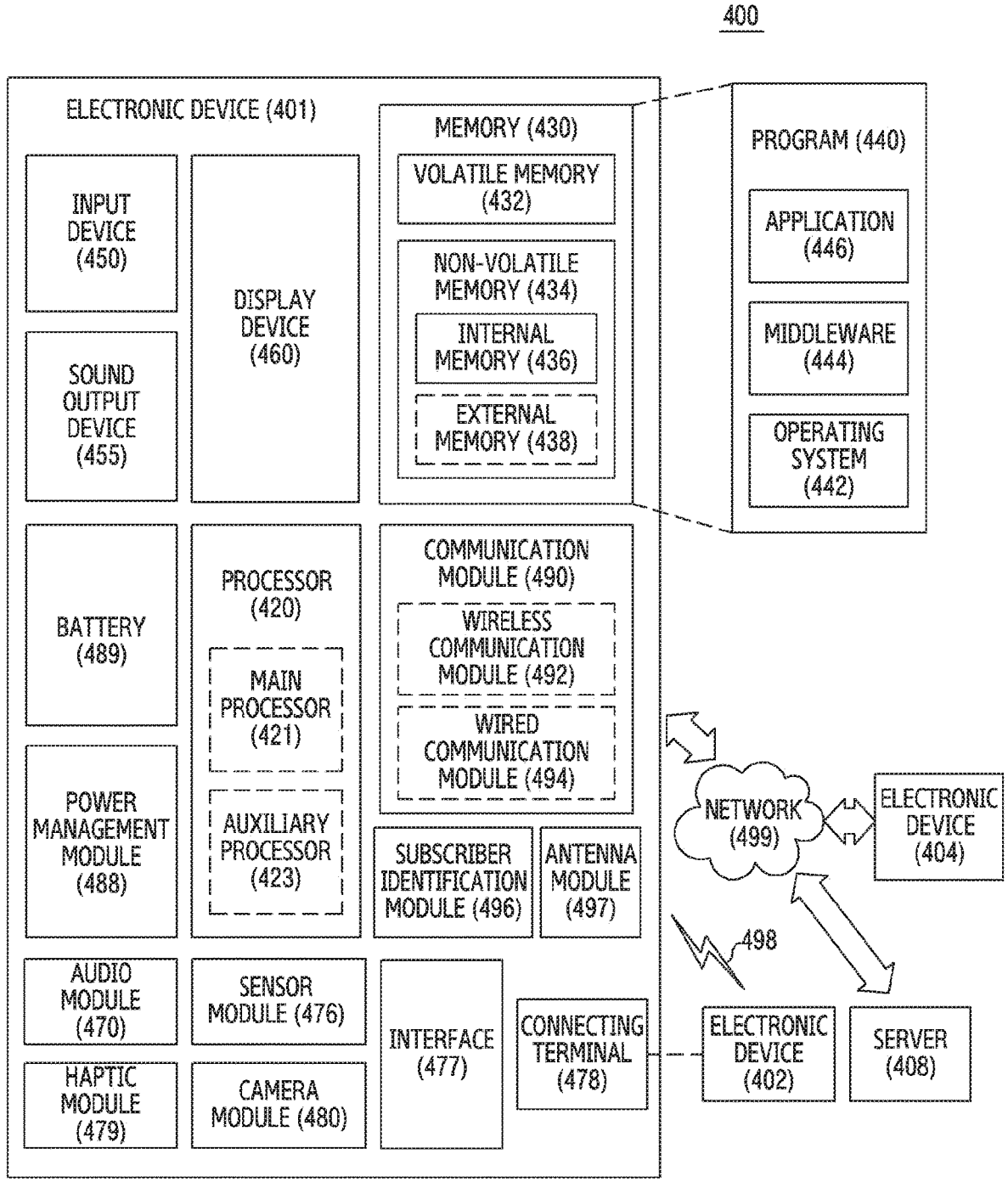
FIG. 4 is a block diagram of an electronic device in a network environment, according to various embodiments.

FIG. 4 is a block diagram illustrating an electronic device 401 in a network environment 400 according to various embodiments. Referring to FIG. 4, the electronic device 401 in the network environment 400 may communicate with an electronic device 402 via a first network 498 (e.g., a short-range wireless communication network), or an electronic device 404 or a server 408 via a second network 499 (e.g., a long-range wireless communication network). According to an embodiment, the electronic device 401 may communicate with the electronic device 404 via the server 408. According to an embodiment, the electronic device 401 may include a processor 420, memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, or an antenna module 497. In some embodiments, at least one (e.g., the display device 460 or the camera module 480) of the components may be omitted from the electronic device 401, or one or more other components may be added in the electronic device 401. In some embodiments, some of the components may be implemented as single integrated circuitry. For example, the sensor module 476 (e.g., a fingerprint sensor, an iris sensor, or an illuminance sensor) may be implemented as embedded in the display device 460 (e.g., a display).

The processor 420 may execute, for example, software (e.g., a program 440) to control at least one other component (e.g., a hardware or software component) of the electronic device 401 coupled with the processor 420, and may perform various data processing or computation. According to one embodiment, as at least part of the data processing or computation, the processor 420 may load a command or data received from another component (e.g., the sensor module 476 or the communication module 490) in volatile memory 432, process the command or the data stored in the volatile memory 432, and store resulting data in non-volatile memory 434. According to an embodiment, the processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). According to an embodiment, the auxiliary processor 423 (e.g., an image signal processor or a communication processor) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input device 450 may receive a command or data to be used by other component (e.g., the processor 420) of the electronic device 401, from the outside (e.g., a user) of the electronic device 401. The input device 450 may include, for example, a microphone, a mouse, a keyboard, or a digital pen (e.g., a stylus pen).

According to an embodiment, the input device 450 includes a plurality of touch keys (e.g., 116 in FIG. 1) disposed at different locations of the electronic device 401. For example, if the electronic device 401 is held by hand, the amount of change in capacitance of the plurality of touch keys varies according to a spatial or location relationship between the hand and the plurality of touch keys. Hereinafter, it is assumed that the electronic device 401 includes a first touch key (e.g., the first touch key 116A in FIG. 1) disposed in the first position and a second touch key (e.g., the second touch key 116B in FIG. 1) disposed in a second position different from the first position.

The sound output device 455 may output sound signals to the outside of the electronic device 401. The sound output device 455 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. According to an embodiment, the display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. According to an embodiment, the audio module 470 may obtain the sound via the input device 450, or output the sound via the sound output device 455 or a headphone of an external electronic device (e.g., an electronic device 402) directly (e.g., wiredly) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. According to an embodiment, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

According to various embodiments, the sensor module 476 includes a first sensing circuit that is electrically connected to the touch key 116 of FIG. 1, and the first sensing circuit detects an amount of change in capacitance of the touch key 116 and provides the amount of change in capacitance or a signal corresponding thereto to the processor 420. According to various embodiments, the sensor module includes a second sensing circuit electrically connected to the antenna module 497, and the second sensing circuit performs grip sensing using the antenna module 497. According to an embodiment, the first sensing circuit and the second sensing circuit is designed as one module or circuit.

The interface 477 may support one or more specified protocols to be used for the electronic device 401 to be coupled with the external electronic device (e.g., the electronic device 402) directly (e.g., wiredly) or wirelessly. According to an embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device (e.g., the electronic device 402). According to an embodiment, the connecting terminal 478 may include, for example, a HDMI connector, a USB connector, a SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment, the haptic module 479 may include, for example, a motor, a piezoelectric element, or an electric stimulator.

The camera module 480 may capture a still image or moving images. According to an embodiment, the camera module 480 may include one or more lenses, image sensors, image signal processors, or flashes.

The power management module 488 may manage power supplied to the electronic device 401. According to one embodiment, the power management module 488 may be implemented as at least part of, for example, a power management integrated circuit (PMIC).

The battery 489 may supply power to at least one component of the electronic device 401. According to an embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the out (e.g., the external electronic device) of the electronic device 401. According to an embodiment, the antenna module 497 may include an antenna including a radiating element composed of a conductive material or a conductive pattern formed in or on a substrate (e.g., PCB). According to an embodiment, the antenna module 497 may include a plurality of antennas. In such a case, at least one antenna appropriate for a communication scheme used in the communication network, such as the first network 498 or the second network 499, may be selected, for example, by the communication module 490 (e.g., the wireless communication module 492) from the plurality of antennas. The signal or the power may then be transmitted or received between the communication module 490 and the external electronic device via the selected at least one antenna. According to an embodiment, another component (e.g., a radio frequency integrated circuit (RFIC)) other than the radiating element may be additionally formed as part of the antenna module 497.

According to an embodiment, the program 440 include instructions to cause the processor 420 entering the frequency control mode while performing communication (for example a call) with an external device via the communication module 490. According to a certain embodiment, the program 440 includes an instruction to cause the processor 420 to enter the frequency adjustment mode when the grip state is identified using the grip sensor. When the grip state is not identified, the communication environment of the electronic device 401 is maintained as a default.

According to an embodiment, the program 440 includes instructions to cause the processor 420 in the frequency adjustment mode to obtain and compare the capacitance change amount of the first touch key (for example, the first touch key 116A of FIG. 1) and the capacitance change amount of the second touch key (for example, the second touch key 116B of FIG. 1) when the capacitance change amount of the first touch key and the capacitance change amount of the second touch key are smaller than a threshold value as a touch input recognition criterion.

According to an embodiment, the program 440 includes instructions to cause the processor 420 in the frequency control mode to recognize that the electronic device 410 and the external object such as a human hand are in the first spatial relationship when amount of change in capacitance of a first touch key is greater than amount of change in capacitance of the second touch key. The program 440 includes instructions to cause the processor 420 in the frequency control mode to recognize that the electronic device 410 and the external object are in a second spatial relationship when the capacitance change amount of the second touch key is greater than the change amount of capacitance of the first touch key.

According to an embodiment of the disclosure, the processor 420 sets the frequency adjustment circuit to the first mode according to the first spatial relationship, and sets the frequency adjustment circuit to the second mode according to the second spatial relationship. The frequency adjustment circuit is designed to be included in the communication module 490 or the antenna module 497, or is designed separately from the communication module 490 or the antenna module 497. According to an embodiment, the communication performance when the frequency main circuit is set to the first mode in the first spatial relationship and the communication performance when the frequency adjustment circuit is set to the second mode in the second spatial relationship are generally constant. According to an embodiment, the first mode or the second mode of the frequency adjustment circuit includes a switching circuit that switches to at least one designated matching circuit or a circuit that adjusts impedance. According to a certain embodiment, the first mode or the second mode of the frequency adjustment circuit includes a circuit for moving the resonant frequency to a specified frequency or moving the resonant frequency by a specified amount. According to a certain embodiment, the frequency adjustment circuit includes a first circuit that connects the first end of the antenna to the feeding part and the second end of the antenna to ground, and a second circuit that connects the first end of the antenna to ground and the second end of the antenna to the feeding part. Depending on the first mode or the second mode, the frequency adjustment circuit switches between the first circuit and the second circuit.

According to an embodiment of the disclosure, the program 440 includes instructions to cause the processor 420 in the frequency control mode to set the first mode or the second mode, and then to determine that the object is close through the proximity sensor (e.g., the first sensor module 104 of FIG. 1). The program 440 includes instructions to cause the processor 420 in the frequency control mode, if the proximity of the object is identified through the proximity sensor, to inactivate the touch keys or to be nonresponsive to the amount of change in capacitance of the touch keys.

According to an embodiment of the disclosure, the program 440 includes instructions to cause the processor 420, after setting the first mode or the second mode, to recognize that a touch input has occurred in the first touch key when the amount of change in capacitance of the first touch key is more than or equal to a threshold value, and that a touch input has occurred in the second touch key when the amount of change in capacitance of the second touch key is more than or equal to the threshold value.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 401 and the external electronic device 404 via the server 408 coupled with the second network 499. Each of the electronic devices 402 and 404 may be a device of a same type as, or a different type, from the electronic device 401. According to an embodiment, all or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

Various embodiments of the document are implemented in software (e.g., program 440) including instructions stored in a machine-readable storage media (e.g., internal memory 436 or external memory 438) readable by a machine (e.g., computer). The device includes an electronic device (e.g., the electronic device 401) according to the disclosed embodiments as a device capable of invoking stored instructions from a storage medium and operating according to the called instructions. When the instruction is executed by a processor (e.g., processor 420), the processor performs a function corresponding to the instruction directly or by using other components under the control of the processor. Instructions include codes generated or executed by a compiler or an interpreter. The storage medium readable by the device is provided in the form of a non-transitory storage medium. Here, 'non-transitory' means that the storage medium does not contain a signal and is tangible, but does not distinguish between data being stored semi-permanently or temporarily on the storage medium.

According to an embodiment, a method according to various embodiments disclosed in the document is provided as being included in a computer program product. Computer program products are commodities that can be traded between sellers and buyers. The computer program product is distributed in the form of a storage medium readable by the device [(e.g., compact disc read only memory (CD-ROM))] or online through an application store (e.g., Play Store™). In the case of online distribution, at least a portion of the computer program product is temporarily stored at least temporarily on a storage medium such as a memory of a manufacturer's server, an application store's server, or a relay server, or is temporarily generated.

Each component (e.g., module or program) according to various embodiments is composed of a singular or a plurality of entities, and some of the aforementioned sub-components may be omitted, or other sub-components may be further include in the embodiment. Alternatively or additionally, some components (e.g., modules or programs) is integrated into one entity, performing the same or similar functions performed by each corresponding component before being integrated. According to various embodiments, operations performed by a module, program, or other component are sequentially, parallelly, repeatedly, or heuristically executed, and at least some operations may be executed in a different order, omitted, or other operations may be added.

Figure 5:
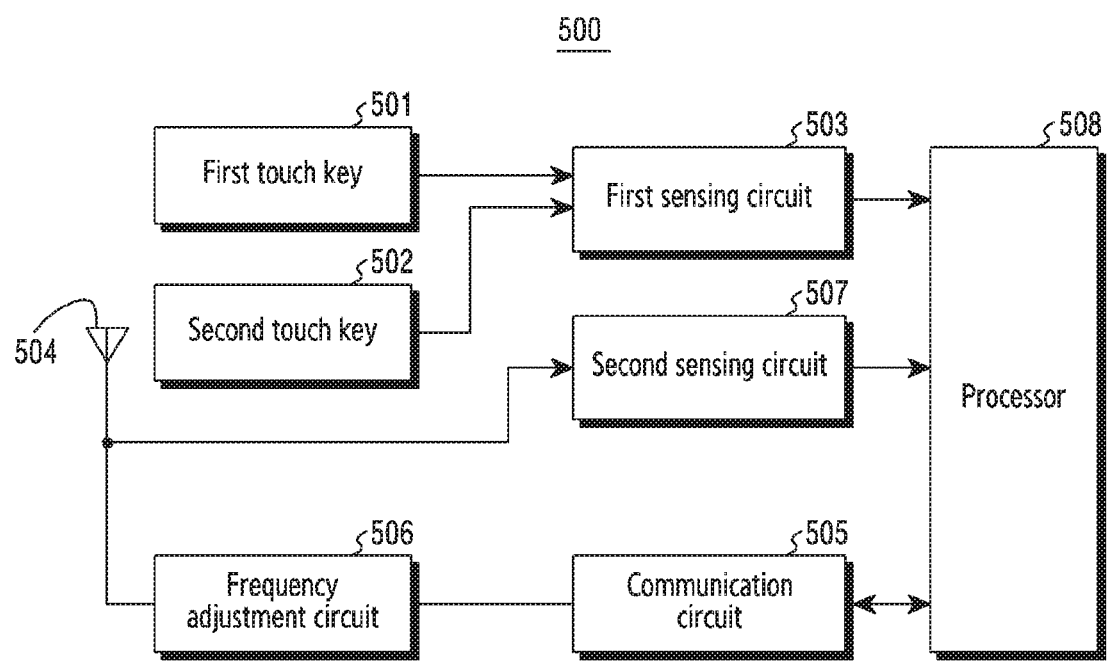
FIG. 5 is a block diagram of an electronic device according to an embodiment.

FIG. 5 is a block diagram of the electronic device according to an embodiment. Referring to FIG. 5, the electronic device 500 (e.g., the electronic device 10 of FIG. 1 or the electronic device 401 of FIG. 4) includes a first touch key 501, a second touch key 502, a first sensing circuit 503, an antenna 504, a communication circuit 505, a frequency adjustment circuit 506, a second sensing circuit 507 and a processor 508. The electronic device 500 additionally includes other components, and at least one of the elements of the electronic device 500 is the same or similar to at least one of the elements of the electronic device 100 of FIGS. 1 and 2 or the electronic device 401 of FIG. 4. Overlapping descriptions are omitted below.

A first touch key 501 (e.g., the first touch key 116A in FIG. 1) and a second touch key 502 (e.g., the second touch key 116B in FIG. 1) are disposed in different areas in the electronic device 500, and are electrically connected to the first sensing circuit 503. According to an embodiment of the disclosure, the electronic device 500 includes a display (e.g., 101 in FIG. 1), and the first touch key 501 is formed in a partial area around the display, and the second touch key 502 is formed in some other area around the display. According to a certain embodiment, the designated first area of the display is used as the first touch key 501, and the designated second area of the display is used as the second turkey key 502. The first sensing circuit 503 (e.g., the sensor module 476 of FIG. 4) detects the amount of change in capacitance of the first touch key 501 or the second touch key 502, and the detected amount of change in capacitance or the equivalent signal is provided to the processor 508 (e.g., the processor 420 of FIG. 4). When the capacitance change amount of the first touch key 501 is greater than or equal to a threshold value, the processor 508 determines that the first touch input has occurred. When the capacitance change amount of the second touch key 502 is greater than or equal to a threshold value, the processor 508 determines that a second touch input has occurred.

The antenna 504 (e.g., the antenna module 497 of FIG. 4) is an element capable of converting a guided electromagnetic wave for transmission into a free space wave or converting a free space wave for reception into a guided electromagnetic wave. It is designed in various forms at various locations of the electronic device 500 based on the radiation characteristics or the impedance. In an embodiment, referring back to FIG. 1, the antenna 504 is disposed between the mid plate and the back plate 111 of the side bezel structure 118, or is mounted on a printed circuit board (not shown).

The communication circuit 505 (e.g., the communication module 490 of FIG. 4) is electrically connected to the antenna 504 and the processor 508. The communication circuit 505 supports various types of communication using the antenna 504. The communication circuit 505 includes RF components such as a radio frequency integrated circuit (RFIC) and a front end module (FEM) between the antenna 504 and the processor 508. For example, the RFIC receives radio waves from the base station through the antenna 504 and modulates the received high frequency signal into a low frequency band (baseband) signal that can be processed by the processor 508. In addition, the RFIC modulates the low frequency signal processed by the processor 508 to a high frequency signal for base station transmission. For example, the FEM connects the antenna 504 with the RFIC and separate the transmit and receive signals. FEM performs filtering and amplifying process and includes a front-end module of receiver incorporating a filter filtering received signals and a front-end module of transmitter incorporating a power amplifier module for amplifying the transmitted signals.

Upon reception of the wireless signal, the communication circuit 505 receives the wireless signal from the antenna 504, converts the received wireless signal into the baseband signal, and provides the converted baseband signal to the processor 508. The processor 508 processes the received baseband signal and controls a human/mechanical interface of the electronic device 500 corresponding to the received baseband signal. In the transmission of the wireless signal, the processor 508 generates a baseband signal and output it to the communication circuit 505. The communication circuit 505 receives the baseband signal from the processor 508, converts the received baseband signal into the wireless signal, and transmits the wireless signal into the air through the antenna 504.

According to various embodiments, the communication circuit 505 supports, using the antenna (504), at least one communication method of SIMO (single input multiple output), MISO (multiple input single output), a diversity (diversity) or MIMO (multiple input multiple output).

The frequency adjustment circuit 506 is electrically connected to the antenna 504 and the communication circuit 505, and is set in the first mode or the second mode under control of the processor 508 during communication (e.g., a call) with an external device through the communication circuit 505.

According to an embodiment of the disclosure, the processor 508 (e.g., the processor 420 of FIG. 4) enters a frequency adjustment mode while performing communication with an external device through the communication circuit 505. In the frequency adjustment mode, the processor 508 obtains and compares the capacitance change amount of the first touch key 501 and the capacitance change amount when the capacitance change amount of the first touch key 501 and the capacitance change amount are less than the threshold as the touch input recognition criteria.

According to an embodiment of the disclosure in the frequency adjustment mode, the processor 508, when the amount of change in capacitance of the first touch key 501 is greater than the amount of change in capacitance of the second touch key 502, recognizes that the electronic device 500 and the external object such as the human hand are in a first spatial relationship. In addition, the processor 508, in the frequency control mode, when the amount of change in capacitance of the second touch key 502 is greater than the amount of change in capacitance of the first touch key 501, recognizes that the electronic device 500 and the external object are in a second spatial relationship.

According to an embodiment, in the frequency adjustment mode, the processor 508 sets the frequency adjustment circuit 506 to the first mode according to the first spatial relationship, and sets the frequency adjustment circuit 506 to the second spatial relationship according to the second spatial relationship. According to an embodiment, the communication performance when the frequency main circuit 506 is set to the first mode in the first spatial relationship and the frequency performance when the frequency adjustment circuit 506 is set to the second mode in the second spatial relationship are approximately constant.

According to an embodiment, the first mode or the second mode of the frequency adjustment circuit 506 includes a switching circuit that switches to at least one designated matching circuit or a circuit that adjusts impedance. According to a certain embodiment, the first mode or the second mode of the frequency adjustment circuit 506 includes a circuit for moving the resonant frequency to a specified frequency or moving the resonant frequency by a specified amount.

According to an embodiment of the disclosure, the processor 508 recognizes that a touch input has occurred in the first touch key 501 when the capacitance change amount of the first touch key 501 is greater than or equal to a threshold value during the frequency adjustment mode. When the amount of change in capacitance of the second touch key 502 is greater than or equal to the threshold, it is recognized that a touch input has occurred in the second touch key 502.

According to a certain embodiment, in the frequency adjustment mode, the processor 508 sets the first mode or the second mode, and then determines whether an object is in proximity through a proximity sensor (e.g., the first sensor module 104 of FIG. 1). In the frequency adjustment mode, when the proximity of the object is identified through the proximity sensor, the processor 508 deactivates the touch keys 501 and 502 or does not react to the capacitance change amount of the touch keys 501 and 502. Such a design, for example, prevents incorrect inputs through the touch keys 501 or 502 or prevents errors in determining the left or right hand grip state when, for example, a part of the human face touches the touch keys 501 or 502 while holding the electronic device 500 with the left or right hand during a call and the human face is approaching the device.

According to a certain embodiment, the frequency adjustment circuit is included in the communication module 490 or the antenna module 497, or is designed separately from the communication module 490 or the antenna module 497.

The second sensing circuit 507 (e.g., the sensor module 476 of FIG. 4) is electrically connected to the antenna 504 and the processor 508, and performs grip sensing using the antenna 504. For example, when a current flows through the antenna 504, an electromagnetic field is formed, and when the electronic device 500 is held by hand, a change in the electromagnetic field (or a change in capacitance) occurs. The second sensing circuit 507 detects the change in capacitance of the antenna 504 and provides the detected change in capacitance or a signal corresponding thereto to the processor 508. The processor 508 determines the grp state based on the change in capacitance. According to an embodiment, the antenna 504 is a common antenna designed to satisfy both the characteristics of the grip sensor antenna and the characteristics and band of the communication antenna. The electronic device 500 includes a structure for branching the grip sensing signal and the communication signal from the antenna 504. For example, the electronic device 500 includes a circuit such as a filter that branches the frequency band for grip sensing and the frequency band for communication.

According to a certain embodiment, a structure, without the filter, is designed that the sensing circuit 507 (or the grip sensor) is electrically connected to feeding (feeding) end of the antenna 504 or any position (for example, where the current distribution is low in order to minimize the influence on the communication antenna performance) of the pattern of the antenna 504. According to an embodiment, a floating inductor is implemented in end of the second detection circuit 507 in order to reduce the influence of a second detection circuit (507) on communication antenna performance.

According to a certain embodiment, when the signal path to the second sensing circuit 507 is designed to be connected to a ground terminal, smooth operation of the second sensing, circuit 507 is difficult, and accordingly, sensing performance according to the antenna type is limited. According to an embodiment, the antenna 504 is designed as mono pole antennas in which the end of the antenna is not connected to the ground and thus improves the grip performance sensing. Due to the inherent characteristics of the monopole antenna, it is easy to be affected by surrounding metal material. Thus, it is designed to obtain a spatial or positional space between the monopole antenna and the surrounding metal. According to another embodiment, the antenna 504 is designed in IFA (inverted F antenna) antenna having the unique characteristics that reduces the influence of surrounding metal material than the monopole antenna. IFA uses the grounding end, so the grip sensing performance is deteriorated. Thus, series capacitors are connected to the ground end in order to apply the open ground to the grip sensor.

According to a certain embodiment, the first sensing circuit 503 and the second sensing circuit 507 is designed as one module or one circuit.

According to an embodiment, the processor 508 is designed to enter the frequency adjustment mode when the grip state is confirmed through the second sensing circuit 507. Such a design reduces power consumption by not performing, for example, an operation of determining a first spatial relationship or a second spatial relationship through the first touch key 501 or the second touch key 502 when the user does not hold the electronic device 500.

Figure 6:
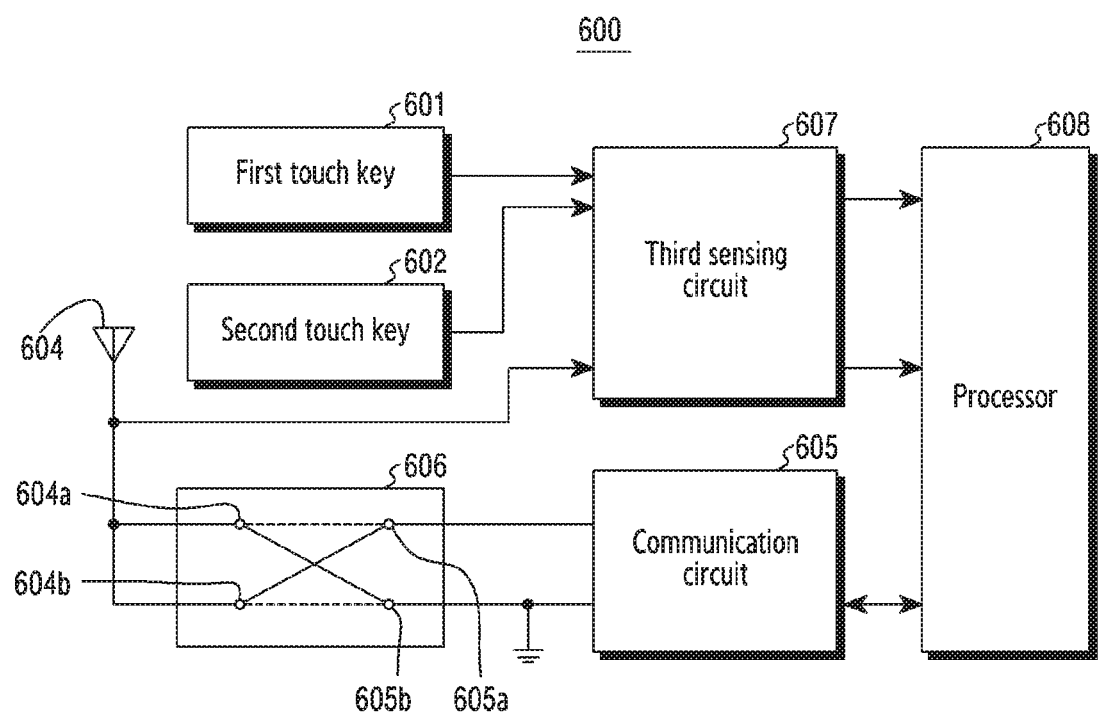
FIG. 6 is a block diagram of an electronic device according to an embodiment.

FIG. 6 is a block diagram of an electronic device in accordance with an embodiment. Referring to FIG. 6, the electronic device 600 (e.g., the electronic device 100 of FIG. 1 or the electronic device 401 of FIG. 4) includes a first touch key 601, a second touch key 602, and an antenna 604, a communication circuit 605, a frequency adjustment circuit 606, a third sensing circuit 607 and a processor 608. The electronic device 600 additionally includes other components, and at least one of the components of the electronic device 600 is the same or similar to at least one of the components of the electronic device 500 of FIG. 5. Duplicate descriptions are omitted below.

The first touch key 601 (e.g., the first touch key 116A in FIG. 1) and the second touch key 602 (e.g., the second touch key 116E in FIG. 1) are disposed in different areas in the electronic device 600 and are electrically connected to the third sensing circuit 607 (e.g., the sensor module 476 of FIG. 4). According to an embodiment of the disclosure, the electronic device 600 includes a display (e.g., 101 in FIG. 1), the first touch key 601 is formed in a partial area around the display, and the second touch key 602 is formed in some other area around the display. According to a certain embodiment, the designated first area of the display is used as the first touch key 601, and the designated second area of the display is used as the second touch key 602. The third sensing circuit 607 detects an amount of change in capacitance of the first touch key 601 or the second touch key 602, and provides the detected capacitance change amount or a signal corresponding thereto, to the processor 608 (for example, processor 420 in FIG. 4). The third sensing circuit 607 is electrically connected to the antenna 604 and, detects the amount of change in capacitance through the antenna 604, and provides the detected capacitance change amount or a signal corresponding thereto, to a processor 608.

The frequency adjustment circuit 606 is electrically connected to the antenna 604 and the communication circuit 605, and is set as the first mode or the second mode under control of the processor 608 during communication (e.g., a call) with an external device through the communication circuit 605. According to an embodiment, the frequency adjustment circuit 606, according to the first mode or the second mode, switches between the first circuit connecting the first end 604a of the antenna 604 with the feeding part (or the feeding end) 605a and connecting the second end 604b of the antenna 604 to the ground (or ground end) 605b, and the second circuit connecting the first end 604a of the antenna 604 to the ground 605b, and connecting the second end 604b of the antenna 604 with the feeding part 605a. According to a certain embodiment, the frequency adjustment circuit 606 is designed to be included in the communication circuit 505.

According to an embodiment of the disclosure, the processor 608 (e.g., 420 of FIG. 4), when the grip state is identified through the third sensing circuit 607 during communicating with an external device through the communication circuit 605, enters a frequency adjusting mode. In the frequency adjustment mode, the processor 608 obtains and compares the amount of change in capacitance of the first touch key 601 and the second touch key 602 when the capacitance change amount of the first touch key 601 and the capacitance change amount of the second touch key 602 are less than the threshold value which is the touch input recognition criteria. In the frequency adjustment mode, the processor 608 sets the frequency adjustment circuit 506 in the first mode or the second mode according to the comparison result of the amount of change in capacitance of the first touch key 601 and the amount of change in capacitance of the second touch key 602. According to an embodiment, the communication performance when the frequency main circuit 506 is set to the first mode in the first spatial relationship and the communication performance when the frequency adjustment circuit 506 is set to the second mode in the second spatial relationship are generally constant.

According to an embodiment, the processor 608 recognizes, during the frequency adjustment mode, that a touch input has occurred in the first touch key 601 when the amount of change in capacitance of the first touch key 601 is greater than or equal to the threshold value, and that a touch input has occurred in the second touch key 602 when the amount of change in capacitance of the touch key 602 is greater than or equal to the threshold.

Figure 7:
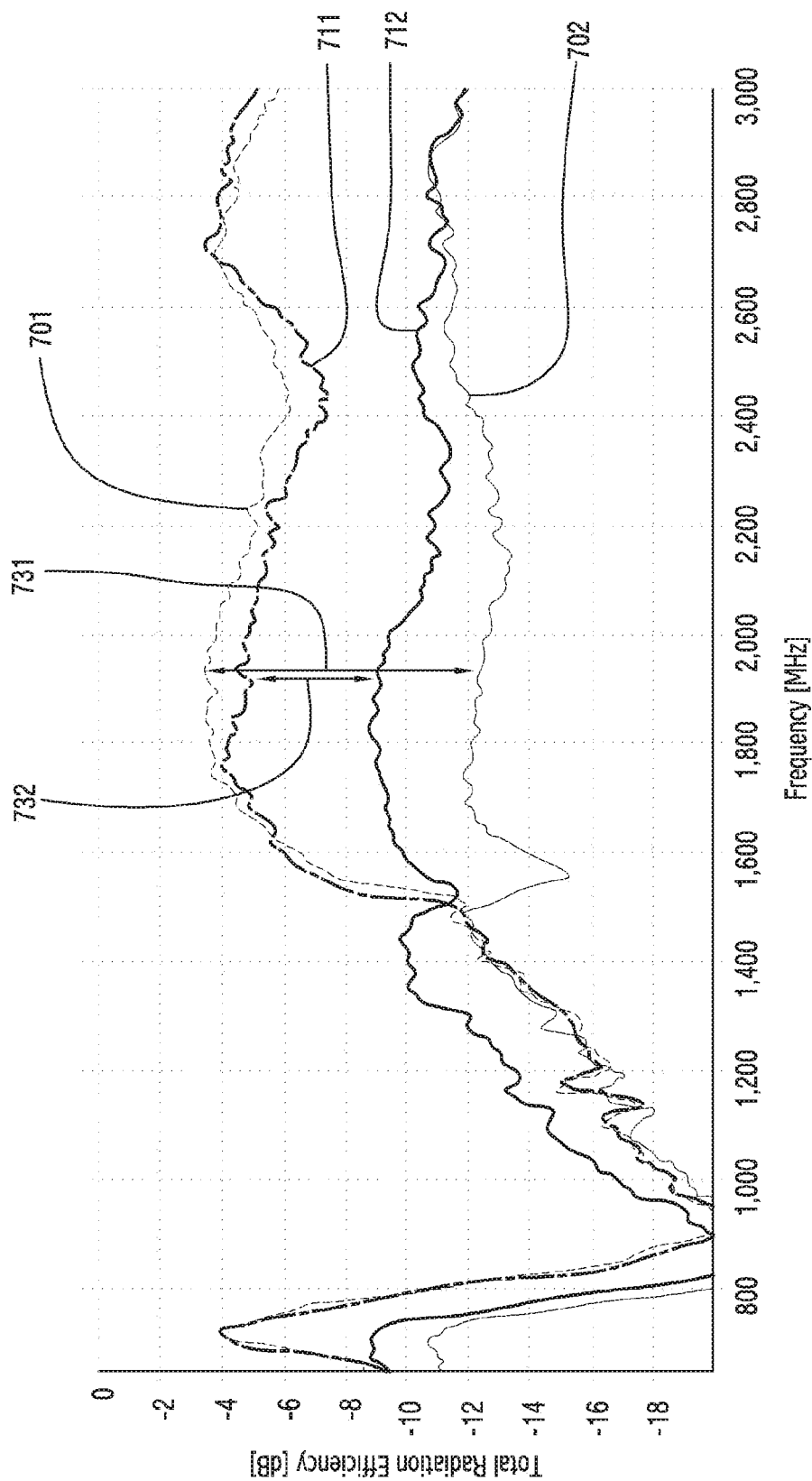
FIG. 7 illustrates a graph of communication performance of a conventional electronic device and a graph of communication performance of an electronic device according to an embodiment.

FIG. 7 illustrates a communication performance of a conventional electronic device and a communication performance of an electronic device according to an embodiment.

Referring to FIG. 7, '701' is a graph showing communication performance according to frequency in a state in which a conventional electronic device is not held by hand, and '702' is a communication performance according to frequency in a state in which a conventional electronic device is held with one hand. '711' is a graph showing communication performance according to frequency in a state in which the electronic device according to the disclosure (e.g., 500 in FIG. 5 or 600 in FIG. 6) is not held by hand, and '712' is a graph showing communication performance according to frequency in a state in which the electronic device according to the disclosure is held with one hand. In the corresponding frequency band (for example, 1800 MHz to 2000 MHz), the communication performance when the electronic device 600 according to the disclosure is not held by hand is compared in small difference with the communication performance when the conventional electronic device is not held by hand in FIG. 7. The meaning of 'small difference in communication performance' corresponds to, for example, a degree that a user can not feel a difference in reception sensitivity during a call. In FIG. 7, It is shown that in the corresponding frequency band, the degree to which communication performance deteriorates when holding the electronic device according to the present disclosure by hand 732 is less than the degree to which communication performance deteriorates when holding the conventional electronic device by hand (731).

Figure 8:
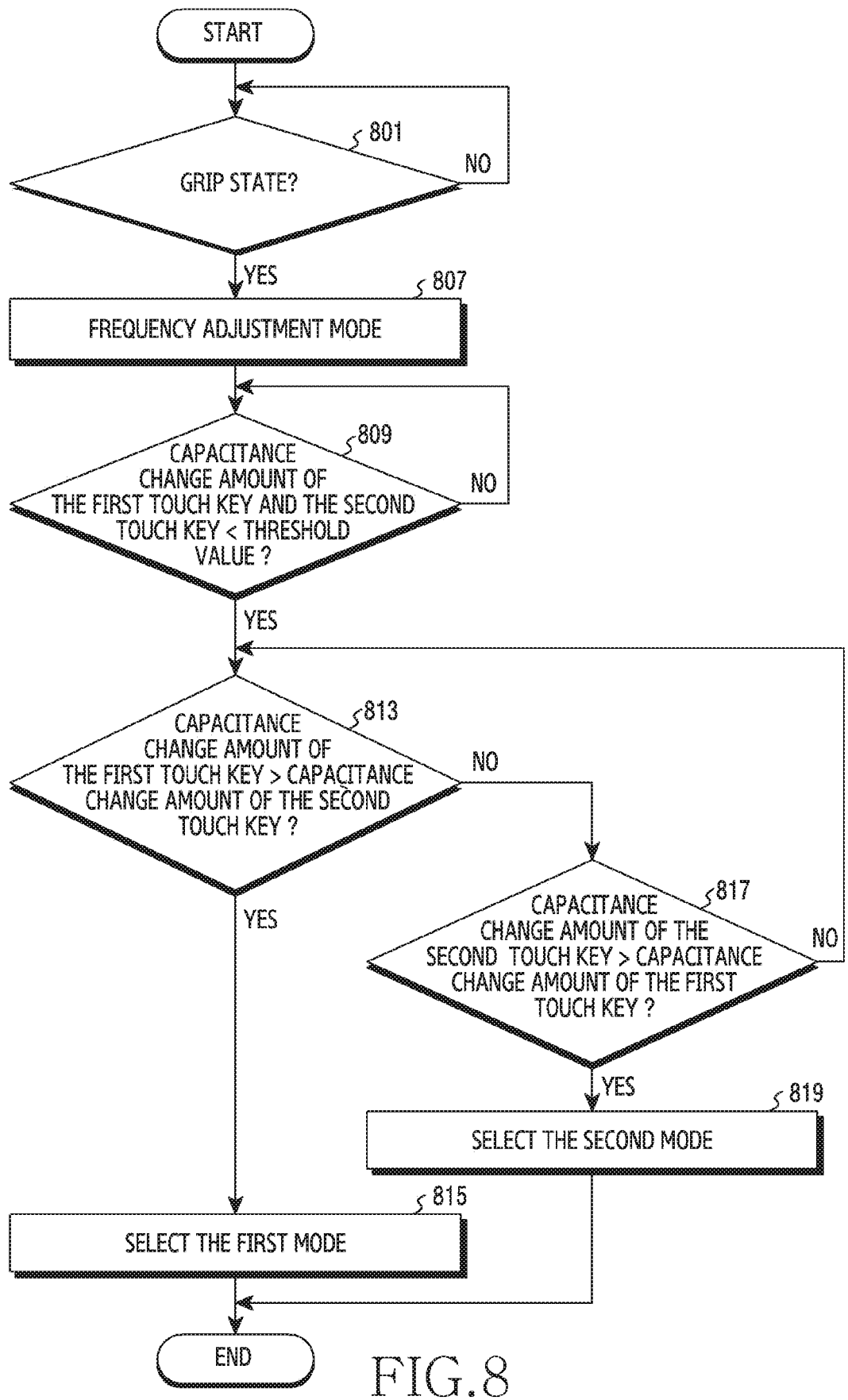
FIG. 8 illustrates an operation flow of an electronic device during communication with an external device according to an embodiment.

FIG. 8 illustrates an operation flow of an electronic device during communication with an external device according to an embodiment. The electronic device may include the electronic device 100 of FIG. 1, the electronic device 401 of FIG. 4, the electronic device 500 of FIG. 5, or the electronic device 600 of FIG. 6.

Referring to FIG. 8, in operation 801, a processor (for example, the processor 420 of FIG. 4) identifies a grip state through a grip sensor. The processor 420 performs operation 807 based on that it is in a grip state, and otherwise performs operation 801 again.

In operation 807, the processor 420 enters a frequency adjustment mode.

In operation 809, in the frequency adjustment mode, the processor 420 obtains an amount of change in capacitance of the first touch key (e.g., the first touch key 116A in FIG. 1) and an amount of change in capacitance of the second touch key (e.g., the second touch key 116B in FIG. 1) from the corresponding sensing circuit, and determines whether the obtained amount of change in capacitance of the first touch key and the obtained amount of change in capacitance of the second touch key are smaller than a threshold value that is a touch input recognition criterion. Processor 420, based on that the obtained amount of change in capacitance of the first touch key and the obtained amount of change in capacitance of the second touch key are smaller than the threshold value, proceeds to the operation 813, and otherwise, proceeds back to operation 809.

In operation 813, the processor 420 determines that the amount of change in capacitance of the first touch key is greater than the amount of change in capacitance of the second touch key. The processor 420 based on that the amount of change in capacitance of the first touch key is greater than the amount of change in capacitance of the second touch key proceeds to operation 815 to select the first mode for the frequency adjustment circuit (for example, the frequency adjusting circuit 506 of FIG. 5). Based on that the amount of change in capacitance of the first touch key is not greater than the amount of change in capacitance of the second touch key, the processor 420 performs operation 817.

In operation 817, the processor 420 determines that the amount of change in capacitance of the second touch key is greater than the amount of change in capacitance of the first touch key. The processor 420 based on that the amount of change in capacitance of the second touch key is greater than the amount of change in capacitance of the first touch key proceeds to operation 819 to select the second mode for the frequency adjustment circuit (for example, the frequency adjusting circuit 506 of FIG. 5). According to an embodiment, the first mode or the second mode includes a switching circuit that switches to at least one designated matching circuit or a circuit that adjusts impedance. According to a certain embodiment, the first mode or the second mode includes a circuit for moving the resonant frequency to a specified frequency or moving the resonant frequency by a specified amount. According to a certain embodiment, the first mode or the second mode includes a first circuit connecting the first end of the antenna with the feeding part and connecting the second end of the antenna with ground, and a second circuit connecting the first end of the antenna with the ground and connecting the second end of the antenna with the feeding part.

The first mode or the second mode is associated with a spatial or positional relationship between an external device, such as a hand holding, and the electronic device. In addition, depending on the spatial or positional relationship between the external object and the electronic device, the influence of the external object on radio wave transmission and reception performance of the electronic device changes. According to an embodiment, the communication performance when the frequency main circuit is set to the first mode in the first spatial relationship and the communication performance when the frequency adjustment circuit is set to the second mode in the second spatial relationship are approximately constant.

Although not shown, the processor 420 is designed to perform an operation to recognize that, during the frequency adjustment mode, a touch input has occurred in the first touch key when the capacitance change amount of the first touch key is greater than or equal to a threshold value, and that a touch input has occurred in the second touch key when the amount of change in capacitance of the second touch key is greater than or equal to the threshold value.

Although not shown, the processor 420, in the frequency adjustment mode, when the proximity of an object is confirmed through the proximity sensor (for example, the sensor module 476 of FIG. 4), disables the touch keys or does not react (no action) in response to change in capacitance of the touch keys.

According to an embodiment of the disclosure, the electronic device 500 includes a first touch key 501 disposed in a first area of the electronic device and a second touch key disposed it a second area of the electronic device 502. The electronic device 500 includes an antenna 504 and a communication circuit 505, electrically connected to the antenna 504, for transmitting or receiving a signal using the antenna 504. The electronic device 500 includes a sensing circuit 607 for detecting an external object (e.g., hand) corresponding to the electronic device 500. The electronic device 500 include a frequency adjustment circuit 506 that is electrically connected to the antenna 504 and adjusts a resonance frequency of the antenna 504, and a processor 508. The processor 508 detects the external object using the sensing circuit 607 while performing communication with the external device using the communication circuit 505. When the external object is detected, the processor 508 detects a change in capacitance corresponding to the external object using the first touch key 501 or the second touch key 502. The processor 508, based on that the amount of change in the first capacitance detected through the first touch key 501 is greater than the amount of change in the second capacitance detected through the second touch key 502, designates the frequency adjustment circuit 506 as the first mode, and performs the communication using the communication circuit 505 while the frequency adjustment circuit 506 is designated as the first mode. The processor 508, based on that the amount of change in the second capacitance is greater than the amount of change in the first capacitance, designates the frequency adjustment circuit 506 as a second mode, and performs the communication using the communication circuit 505 while the frequency adjustment circuit 506 is designated as the second mode.

According to an embodiment of the disclosure, the processor 508, when the first capacitance change amount and the second capacitance change amount is less than a threshold value, performs an operation to set the frequency adjustment circuit 505 as the first mode or the second mode.

According to an embodiment of the disclosure, the processor 508 recognizes a touch input based on that the amount of change in the first capacitance or the amount of change in the second capacitance is greater than or equal to the threshold.

According to an embodiment of the disclosure, the sensing circuit 607 is a grip sensor.

According to an embodiment of the disclosure, the grip sensor is electrically connected to the antenna 504.

According to an embodiment of the disclosure, the sensing circuit 607 is electrically connected to the first and second touch keys 501 and 502, and obtains the amount of change in capacitance of the first and second touch keys 501 and 502 and provide them to the processor 508.

According to an embodiment of the disclosure, the frequency adjustment circuit 506 adjusts the impedance according to the first mode or the second mode.

According to an embodiment, the frequency adjusting circuit 506 switches to at least one matching circuit according to the first mode or the second mode.

According to an embodiment of the disclosure, the frequency adjustment circuit 506 moves the resonance frequency to a specified frequency according to the first mode or the second mode, or moves the resonance frequency by a specified amount.

According to an embodiment of the disclosure, the frequency adjustment circuit 506 includes a first circuit that connects the first end of the antenna with a feeding part and the second end of the antenna to the ground and a second circuit that connects the first end of the antenna to the ground and the second end of the antenna to the feeding part. The frequency adjustment circuit 506 switches to the first the first circuit and second circuit according to the first mode or the second mode.

According to an embodiment of the disclosure, the electronic device 500 includes a display (e.g., the display 101 of FIG. 1), and a first area is formed in a partial area of the display 101, and a second area is formed in some other area of the display 101.

According to an embodiment of the disclosure, the electronic device 600 includes an antenna 604 and a feeding part 605*a* electrically connected to the antenna 604, and includes a communication circuit 605 for transmitting or receiving a signal using the antenna 604. The electronic device 600 includes a ground electrically connected to the antenna and the communication circuit. The electronic device 600 includes a sensing circuit 607 for sensing an external object corresponding to the electronic device 600. The electronic device 600 includes a frequency adjustment circuit 606 electrically connected to the antenna 604 and capable of adjusting the resonance frequency of the antenna 604. The electronic device 600 includes a processor 608, and the processor 608 detects external objects using the sensing circuit 607 while performing communication with an external device using the communication circuit 605. When the external object is detected, the processor 608 designates the frequency adjustment circuit 606 as a first mode in which the first end 604*a* of the antenna 604 is connected with the feeding part 605*a* and the second end 604*b* of the antenna 604 is connected with the ground 605*b*, or as a second mode in which the second end 604*b* of the antenna 604 is connected with the feeding part 605*a* and the first end 604*a* of the antenna 604 is connected with the ground 605*b*. The processor 608 performs the communication using the communication circuit 605 while the frequency adjustment circuit 606 is designated as the first mode or the second mode.

According to an embodiment of the disclosure, the electronic device 600 further includes a first touch key 601 and a second touch key 601 disposed in different areas of the electronic device 600. The processor 608 detects a capacitance change amount corresponding to the external object using the first touch key 601 or the second touch key 602. The processor 608 adjusts the frequency adjustment circuit 606 as the first mode based on that the first capacitance change amount detected through the first touch key 601 is greater than the second capacitance change amount detected through the second touch key 602, and as the second mode based on that the second capacitance change amount detected through the second touch key 602 is greater than the first capacitance change amount detected through the first touch key 601.

According to an embodiment of the disclosure, the processor 608, when the first capacitance change amount and the second capacitance change amount is less than a threshold value, performs an operation to set the frequency adjustment circuit 606 as the first mode or the second mode.

According to an embodiment of the disclosure, the processor 608 recognizes a touch input when the amount of change in the first capacitance or the amount of change in the second capacitance is greater than or equal to the threshold.

According to an embodiment of the disclosure, the sensing circuit 607 is electrically connected to the first and second touch keys 601 and 602, and the amount of change in capacitance of the first and second touch keys 601 and 602 are obtained and provided to the processor 608.

According to an embodiment of the disclosure, the sensing circuit 607 is a grip sensor.

According to an embodiment of the disclosure, the grip sensor is electrically connected to the antenna 604.

According to an embodiment of the disclosure, the electronic device 600 includes a display (e.g., the display device 460 of FIG. 4), and the first touch key 601 is formed in the first area of the display 460, and the second touch key 602 is formed in the second area of the display 460.

So far, the disclosure has bees focused on the preferred embodiments. Those skilled in the art to which the disclosure pertains will understand that the disclosure can be implemented in a modified fore without departing from the essential characteristics of the disclosure. Therefore, the disclosed embodiments should be considered in terms of explanation, not limitation. The scope of the disclosure is described in the claims rather than the foregoing description, and all differences within the equivalent range should be construed as being included in the disclosure.

The invention claimed is:

1. An electronic device, comprising:
   a first touch key disposed in a first area of the electronic device;
   a second touch key disposed in a second area of the electronic device;
   an antenna;
   a communication circuit, electrically connected to the antenna, transmitting or receiving a signal using the antenna;
   a sensing circuit for sensing an external object corresponding to the electronic device;

a frequency adjustment circuit, electrically connected to the antenna, adjusting a resonance frequency of the antenna; and a processor, wherein the processor detects the external object using the sensing circuit while communicating with an external device using the communication circuit, in response to detecting the external object, detects an amount of change of capacitance corresponding to the external object using the first touch key or the second touch key, based on that a first amount of change of capacitance detected through the first touch key is greater than a second amount of change of capacitance detected through the second touch key, communicates using the communication circuit wherein the frequency adjustment circuit is designated in a first mode, based on that the second amount of change of capacitance detected through the second touch key is greater than the second amount of change of capacitance detected through the first touch key, communicates using the communication circuit wherein the frequency adjustment circuit is designated in a second mode.

2. The electronic device of claim 1, wherein the processor designates the frequency adjustment circuit in the first mode or the second mode based on that the first amount of change of capacitance and the second amount of change of capacitance are less than a threshold value.

3. The electronic device of claim 1, wherein the processor detects a touch input based on that the first amount of change of capacitance or the second amount of change of capacitance is greater than or equal to a threshold value.

4. The electronic device of claim 1, wherein the sensing circuit is a grip sensor.

5. The electronic device of claim 4, wherein the grip sensor is electrically connected to the antenna.

6. The electronic device of claim 1, wherein the sensing circuit is electrically connected to the first key and the second touch key, wherein the sensing circuit obtains a change in capacitance through the first and a change in capacitance through the second touch key, and wherein the sensing circuit provides the change in capacitance detected through the first and the change in capacitance detected through the second touch key to the processor.

7. The electronic device of claim 1, wherein the frequency adjustment circuit adjusts impedance according to the first mode or the second mode.

8. The electronic device of claim 1, wherein the frequency adjustment circuit switches to at least one matching circuit according to the first mode or the second mode.

9. The electronic device of claim 1, wherein the frequency adjustment circuit, according to the first mode or the second mode, move the resonance frequency to the designated frequency, or shift the resonance by specified amount.

10. The electronic device of claim 1, wherein the frequency adjustment circuit includes a first circuit connecting a first end of the antenna with a feeding part and a second end of the antenna with a ground, and a second circuit connecting the first end of the antenna with the ground and the second end of the antenna with the feeding part, Wherein the frequency adjustment circuit switches the first circuit and the second circuit according to the first mode or the second mode.

11. The electronic device of claim 1, wherein the electronic device includes a display, and wherein the first area is formed in a partial area of the display and the second area is formed in another part of the display.

12. The electronic device of claim 1, wherein the electronic device further includes a proximity sensor aligned with a portion of the exposed area of the display, and wherein the processor deactivates the display, the first touch key, and the second touch key in response to detecting a signal associated with an approach of an object through the proximity sensor.

13. The electronic device of claim 1, wherein the sensing circuit is electrically connected to the antenna, wherein the electronic device further comprises a filter for branching a signal through the antenna into a signal of a first frequency band associated with the sensing circuit and a signal of a second frequency band associated with the communication circuit, and wherein the second frequency band is different from the first frequency band.

14. The electronic device of claim 13, wherein the first frequency band is between 1 MHz to 13 MHz.

15. The electronic device of claim 1, wherein the first touch key and the second touch key are separated by a home key button.

* * * * *